United States Patent
Gruber et al.

(10) Patent No.: US 10,545,199 B2
(45) Date of Patent: *Jan. 28, 2020

(54) LATERAL TRANSMISSION OF SIGNALS ACROSS A GALVANIC ISOLATION BARRIER

(71) Applicant: Infineon Technologies Austria AG, Villach (AT)

(72) Inventors: Hermann Gruber, Woerth a. D. (DE); Sergio Morini, Pavia (IT); Wolfgang Raberg, Sauerlach (DE); Holger Wille, Neutraubling (DE)

(73) Assignee: Infineion Technologies Austria AG, Villach (AT)

( * ) Notice: Subject to any disclaimer, the term of this patent is extended or adjusted under 35 U.S.C. 154(b) by 0 days.

This patent is subject to a terminal disclaimer.

(21) Appl. No.: 16/413,340

(22) Filed: May 15, 2019

(65) Prior Publication Data
US 2019/0265313 A1    Aug. 29, 2019

Related U.S. Application Data

(63) Continuation of application No. 15/385,743, filed on Dec. 20, 2016, now Pat. No. 10,324,144.

(51) Int. Cl.
*G01R 33/09* (2006.01)
*H03K 17/691* (2006.01)

(52) U.S. Cl.
CPC ......... *G01R 33/093* (2013.01); *H03K 17/691* (2013.01)

(58) Field of Classification Search
CPC .... H03K 17/689; H03K 17/691; G01R 33/09; G01R 33/093
See application file for complete search history.

(56) References Cited

U.S. PATENT DOCUMENTS

| | | | |
|---|---|---|---|
| 6,054,780 A | 4/2000 | Haigh et al. | |
| 7,239,000 B2 | 7/2007 | Witcraft et al. | |
| 7,420,365 B2 | 9/2008 | Witcraft et al. | |
| 10,324,144 B2* | 6/2019 | Gruber | H03K 17/691 |
| 2001/0017543 A1 | 8/2001 | Daughton et al. | |
| 2005/0018478 A1 | 1/2005 | Nagase et al. | |

(Continued)

FOREIGN PATENT DOCUMENTS

DE    19922123 A1    11/2000
EP    1302778 A2    4/2003

(Continued)

OTHER PUBLICATIONS

Prosecution History from U.S. Appl. No. 15/385,743, dated Oct. 5, 2018 through Feb. 8, 2019, 25 pp.

*Primary Examiner* — Patrick O Neill
(74) *Attorney, Agent, or Firm* — Shumake & Sieffert, P.A.

(57) ABSTRACT

In some examples, a device includes a first conductive region and a second conductive region that is galvanically isolated from the first conductive region. The device further includes one or more conductors, wherein each conductor of the one or more conductors is electrically connected to circuitry in the first conductive region. The device also includes a giant magnetoresistive (GMR) sensor electrically connected to circuitry in the second conductive region and magnetically coupled to the one or more conductors, wherein the GMR sensor is positioned at least partially lateral relative to the one or more conductors.

20 Claims, 11 Drawing Sheets

(56) References Cited

U.S. PATENT DOCUMENTS

| | | |
|---|---|---|
| 2005/0232001 A1 | 10/2005 | Tsuji |
| 2005/0269657 A1 | 12/2005 | Dupuis |
| 2006/0139991 A1 | 6/2006 | Aoki |
| 2007/0052412 A1 | 3/2007 | Desplats et al. |
| 2007/0086121 A1 | 4/2007 | Nagase et al. |
| 2007/0170533 A1 | 7/2007 | Doogue et al. |
| 2007/0216406 A1 | 9/2007 | Witcraft et al. |
| 2009/0206817 A1 | 8/2009 | Ng et al. |
| 2010/0259250 A1 | 10/2010 | Kahlman |
| 2013/0055052 A1 | 2/2013 | Kaeriyama |
| 2015/0070073 A1 | 3/2015 | Moghe et al. |
| 2016/0093570 A1 | 3/2016 | Watanabe et al. |
| 2018/0172783 A1 | 6/2018 | Gruber et al. |

FOREIGN PATENT DOCUMENTS

| | | |
|---|---|---|
| JP | 2008060443 A | 3/2008 |
| WO | 2015047368 A1 | 4/2015 |

\* cited by examiner

LATERAL TRANSMISSION OF SIGNALS ACROSS A GALVANIC ISOLATION BARRIER

The present application is a continuation of U.S. application Ser. No. 15/385,743, filed Dec. 20, 2016, the entirety of which is hereby incorporated by reference.

TECHNICAL FIELD

This disclosure relates to signal transmission and information transfer.

BACKGROUND

An isolation circuit for signal transmission across an isolation barrier may include a coil that is magnetically coupled to a magnetoresistive (MR) element or giant magnetoresistive (GMR) element. The MR or GMR element has a resistance that is variable in response to a magnetic field applied by the coil. The isolation circuit may include a Faraday shield interposed between the coil and the MR element. The entire structure may be formed monolithically as an integrated circuit on a single substrate.

SUMMARY

This disclosure describes techniques for increasing the electrical isolation between a giant magnetoresistive (GMR) sensor and one or more conductors that are configured to transmit magnetic signals to the GMR sensor. The GMR sensor and the one or more conductors may be separated by an isolation barrier to prevent the conduction of electricity between a first conductive region and a second conductive region. To increase the electrical isolation between the two regions, the one or more conductors may be positioned both vertically across the isolation barrier and laterally along the isolation barrier.

In some examples, a device includes a first conductive region and a second conductive region that is galvanically isolated from the first conductive region. The device further includes one or more conductors, wherein each conductor of the one or more conductors is electrically connected to circuitry in the first conductive region. The device also includes a giant magnetoresistive (GMR) sensor electrically connected to circuitry in the second conductive region and magnetically coupled to the one or more conductors, wherein the GMR sensor is positioned at least partially lateral relative to the one or more conductors.

In some examples, a method for communicating includes transmitting a magnetic signal via one or more conductors, wherein each conductor of the one or more conductors is electrically connected to circuitry in a first conductive region. The method further includes receiving the magnetic signal via a giant magnetoresistive (GMR) sensor electrically connected to circuitry in a second conductive region that is galvanically isolated from the first conductive region, wherein the GMR sensor is positioned at least partially lateral relative to the one or more conductors.

In some examples, a semiconductor device includes a single semiconductor die, wherein the single semiconductor die includes a first conductive region, a second conductive region that is galvanically isolated from the first conductive region, and an insulating material. The semiconductor device further includes the one or more conductors positioned at least partially inside the insulating material, wherein each conductor of the one or more conductors are electrically connected to circuitry in the first conductive region. The semiconductor device also includes a giant magnetoresistive (GMR) sensor electrically connected to circuitry in the second conductive region and magnetically coupled to the one or more conductors, wherein the one or more conductors are configured to transmit magnetic signals at least partially laterally through the insulating material to the GMR sensor.

The details of one or more examples are set forth in the accompanying drawings and the description below. Other features, objects, and advantages will be apparent from the description and drawings, and from the claims.

DETAILED DESCRIPTION

Figure 1:
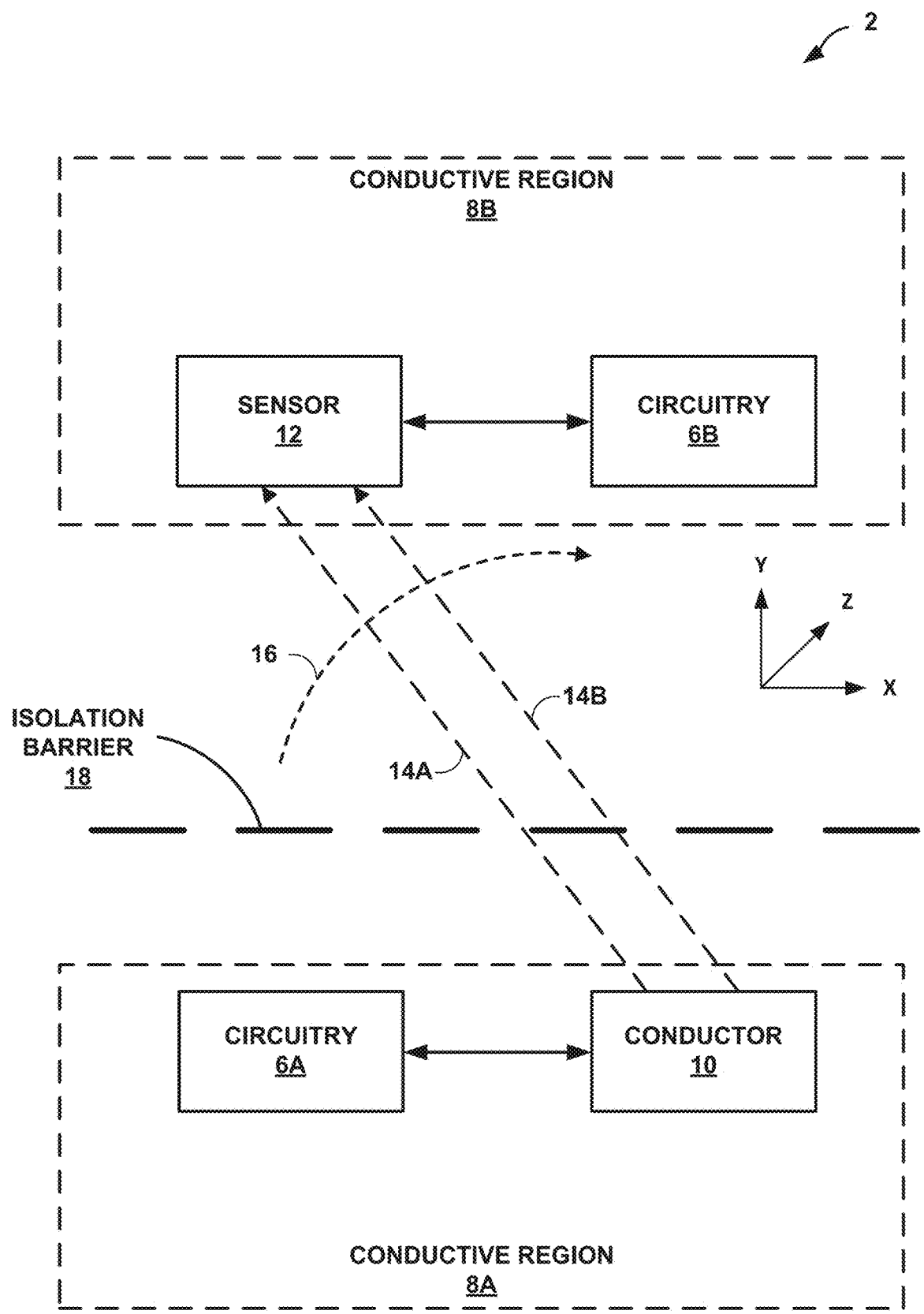
FIG. 1 is a conceptual block diagram of a device for laterally communicating across an isolation barrier using a conductor and a sensor, in accordance with some examples of this disclosure.

Communicating across a voltage difference may require galvanic isolation, such as an isolation barrier, between transmission circuitry and receiver circuitry. The durability of the isolation barrier may depend on its thickness. However, increasing the thickness of the isolation barrier may increase the cost and the size of a device. Increasing the thickness of the isolation barrier may also lead to a substantial redesign of the device. To effectively increase the thickness of the isolation barrier without using additional insulating material or reworking the design of the device, the device may implement communication between the transmitter and the receiver that is at least partially lateral.

A device may include two conductive regions that are galvanically isolated. A first conductive region of the device may be electrically connected to one or more conductors that are configured to transmit magnetic signals in a direction that is at least partially lateral. A second conductive region of the device may be electrically connected to a giant magnetoresistive (GMR) sensor that is configured to receive the magnetic signals from the one or more conductors. The at least partially lateral transmission of the magnetic signals may effectively increase the distance of transmission across an isolation barrier, thereby reducing the risk of breakdown of the isolation barrier, without the cost and time-consuming design process of increasing the thickness of the isolation barrier. The increased distance and the lateral placement of the one or more transmitting conductors may lead to a reduced signal strength at the GMR sensor, but the signal strength may be increased by designing the one or more conductors to increase the number of turns or increase the strength of the electrical current through the one or more conductors. It may be less expensive and easier to position the one or more conductors lateral relative to the GMR sensor than to increase the thickness of the isolation barrier.

In the example of a semiconductor device, the isolation barrier may be a substantial consideration in the design of the semiconductor device. In some examples, a semiconductor device may include a voltage difference of hundreds of volts up to more than one thousand volts. The isolation barrier may be designed to withstand this voltage drop to prevent the breakdown and potential failure of the semiconductor device. Increasing the thickness of the isolation barrier may increase the cost of the semiconductor device. Increasing the thickness of the isolation barrier may also affect the design of other portions of the semiconductor device, which may lead to further testing and redesign. For example, an IC may be designed to be relatively flat in the vertical direction, and it may be easier to expand the IC in horizontal directions than to expand the IC in the vertical direction. Thus, at least partially lateral communication across the isolation barrier may be an inexpensive and simple method to the increase the breakdown voltage of the isolation barrier.

FIG. 1 is a conceptual block diagram of a device 2 for laterally communicating across an isolation barrier 18 using a conductor 10 and a sensor 12, in accordance with some examples of this disclosure. Device 2 may include conductive regions 8A, 8B that are separated by isolation barrier 18 such that conductive region 8A may include a different voltage than conductive region 8B. Conductive region 8A may be electrically connected to circuitry 6A, which may include transmission circuitry that is configured to generate signals to transmit to conductive region 8B through conductor 10. Circuitry 6A may include drive circuitry with one or more transistors located in conductive region 8A, where the one or more transistors are configured to drive signals through conductor 10. Conductive region 8B may be electrically connected to circuitry 6B, which may include receiver circuitry that is configured to process the signals received from conductive region 8A through sensor 12. Conductive region 8B may also include circuitry to measure the impedance, electrical current, or voltage across sensor 12.

Conductor 10 is magnetically coupled to sensor 12 such that conductor 10 may be configured to transmit magnetic signals to sensor 12. Conductor 10 may be electrically connected to conductive region 8A and positioned at least partially lateral relative to sensor 12. FIGS. 4A and 5-6B depict examples of relative lateral positions for conductor 10 and sensor 12. In some examples, conductor 10 may include one or more conductors, where each conductor of conductor 10 is electrically connected to conductive region 8A. The one or more conductors of conductor 10 may be connected in series to form a magnetizing coil configured to transmit a magnetic signal across isolation barrier 18 to sensor 12. Connecting the one or more conductors of conductor 10 in series as a magnetizing coil may decrease the total current through conductor 10. Alternatively or additionally, the one or more conductors of conductor 10 may be connected in parallel to decrease the impedance of conductor 10.

Conductor 10 may include any suitable conductive material such as a metallic material and/or polysilicon. If conductor 10 includes polysilicon, the polysilicon may be heavily doped with impurities to increase the conduction of the polysilicon. A current through conductor 10 may generate magnetic field 16 based on the Biot-Savart Law and the right-hand rule that is perpendicular to vectors 14A, 14B from conductor 10 to sensor 12. In the example depicted in FIG. 1, magnetic field 16 near sensor 12 may include a component in the x-axis direction and a component in the y-axis direction.

Sensor 12 may include a giant magnetoresistive (GMR) sensor configured to receive magnetic signals across isolation barrier 18 from conductor 10. Sensor 12 may include an impedance that changes as a function of a magnetic field generated by conductor 10. In some examples, if sensor 12 includes a GMR sensor, the impedance of sensor 12 may change based on lateral magnetic fields in the x-axis direction that are perpendicular to the long axis of the GMR sensor. In the example of FIG. 1, the long axis of sensor 12 may extend in the z-axis direction. If sensor 12 includes a GMR sensor, sensor 12 may not change impedance based on vertical magnetic fields in the y-axis direction. In some examples, sensor 12 may include a tunnel magnetoresistance (TMR) sensor and/or an anisotropic magnetoresistance (AMR) sensor instead of or in addition to a GMR sensor.

Conductor 10 may be offset from sensor 12 in the x-axis direction and the y-axis direction. The distance between conductor 10 and sensor 12 may increase by offsetting conductor 10 in the x-axis direction from sensor 12. An increase in the distance between conductor 10 and sensor 12 may increase the breakdown voltage of isolation barrier 18 with respect to conductor 10 and sensor 12. Increasing the breakdown voltage with respect to conductor 10 and sensor 12 may be less expensive than increasing the thickness of isolation barrier 18.

Isolation barrier 18 may prevent and/or impede the conductive of electricity between conductive regions 8A-8B. Isolation barrier 18 may electrically isolate conductive region 8A from conductive region 8B. Without isolation barrier 18, a short circuit may occur between conductive regions 8A, 8B. In some examples, electrical isolation may mean zero electrical current or a very high-ohm connection between two or more components. In some examples, even though two components are designed to be electrically isolated, there may be leakage current, electron tunneling, or other means for electrical current to flow at very low rates. In addition, two electrically isolated components may include capacitance between the two components, and one component may produce an electric field that affects an electrically isolated component. For purposes of this disclosure, "electrically connected" may refer to two components that have a low-ohm or zero-ohm connection. In some examples, even though two components are designed to be electrically connected, there may be nonzero resistance, nonzero capacitance, and/or nonzero inductance between the two components.

Isolation barrier 18 may include an electrically insulating material configured to impede the conduction of electricity between conductive regions 8A, 8B. Isolation barrier 18 may allow magnetic signals to pass through isolation barrier 18. In examples where device 2 includes a semiconductor device, isolation barrier 18 may include an oxide such as silicon dioxide for impeding the conduction of electricity while allowing electrical fields and magnetic fields to pass through.

The breakdown voltage of isolation barrier 18 may depend on the material of isolation barrier 18 and the thickness of isolation barrier 18. The cost and size of device 2 may also depend on the thickness of isolation barrier 18. To increase the breakdown voltage of isolation barrier 18 without increasing the thickness of isolation barrier 18, conductor 10 may be positioned at least partially lateral relative to sensor 12. The thickness of isolation barrier 18 may be based on the technology used for device 2, such that a change in the thickness of isolation barrier 18 may lead to changes to other portions of device 2.

Figure 2:
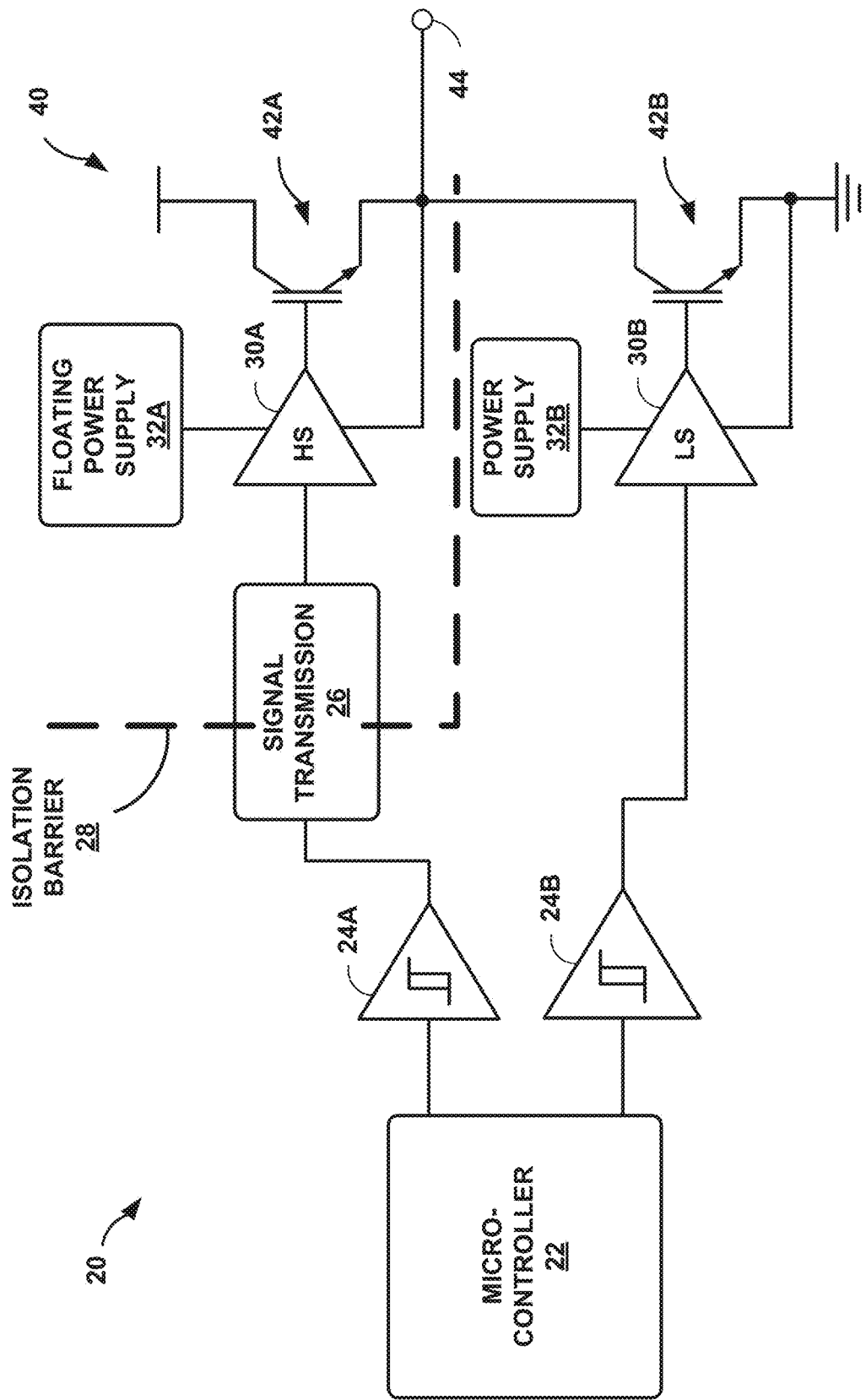
FIG. 2 is a circuit diagram of a control circuit and a half-bridge circuit, in accordance with some examples of this disclosure.

FIG. 2 is a circuit diagram of a control circuit 20 and a half-bridge circuit 40, in accordance with some examples of this disclosure. Control circuit 20 may include microcontroller 22, Schmitt triggers 24A, 24B, isolation barrier 28, gate drivers 30, and power supplies 32. Half bridge circuit 40 may include high-side switch 42A, low-side switch 42B, and output node 44. Control circuit 20 and half-bridge circuit 40 may be an example of laterally transmitting a signal from a first conductive region to a second conductive region, where the two conductive regions are electrically isolated. Other examples may include ICs configured to generate signals for electric drives, medical equipment, and any other suitable application for transmission of signals across isolation barrier 28.

Microcontroller 22 may be configured to generate control signals to control the operation of half-bridge circuit 40. The control signals may include an enabling period for high-side switch 42A, and an enabling period for low-side switch 42B, and dead time between each of the enabling periods. The enabling period for high-side switch 42A may cause high-side switch 42A to conduct electricity from a high-side power supply, such as floating power supply 32A, to output node 44. The enabling period for low-side switch 42B may cause low-side switch 42B to conduct electricity from output node 44 to a reference voltage power supply such as reference ground.

Schmitt triggers 24A, 24B may include comparators and/or operational amplifiers with feedback loops. Schmitt triggers 24A, 24B may operate similar to comparators with hysteresis such that the threshold input voltage for changing the output voltage is dependent on the current output voltage. Schmitt triggers 24A, 24B may operate as one-bit analog to digital converters. Microcontroller 22 and/or Schmitt trigger 24A may be an example of circuitry 6A in FIG. 1 that is electrically connected to one or more conductors.

Control circuit 20 may include signal transmission 26 across isolation barrier 28. In some examples, high-side gate driver 30A may include a different voltage than low-side gate driver 30B because a voltage difference between floating power supply 32A and power supply 32B. To transmit signals across isolation barrier 28, control circuit 20 may include inductive or capacitive transmission of signals. Isolation barrier 28 may electrically isolate microcontroller 22, Schmitt triggers 24A, 24B, and low-side gate driver 30B from high-side gate driver 30A.

Isolation barrier 28 may include a voltage difference that, in some examples, is hundreds of volts. In some examples, the thickness of isolation barrier 28 may be three, four, six, or eight micrometers or any other suitable thickness for a gate driver IC configured to drive the switches of a half-bridge circuit. With vertical transmission of signals, isolation barrier 28 may include a thickness of four micrometers for a voltage difference of six-hundred volts and a thickness of eight micrometers for a voltage difference of twelve-hundred volts. With at least partially lateral transmission of signals, the thickness of isolation barrier 28 may decrease to three micrometers for a voltage difference of six-hundred volts and a thickness of six micrometers for a voltage difference of twelve-hundred volts.

Half-bridge circuit 40 may be configured to drive an electric motor and/or operate as a power conversion circuit. Half-bridge circuit 40 may also operate in a variety of other applications, such as electronics and/or medical equipment. Switches 42A, 42B may include, but are not limited to, an insulated-gate bipolar transistor (IGBT), any type of field-effect transistor (FET), a bipolar junction transistor (BJT), a high-electron-mobility transistor (HEMT), a gallium-nitride (GaN) based transistor, or another element that uses voltage for its control.

Figure 3:
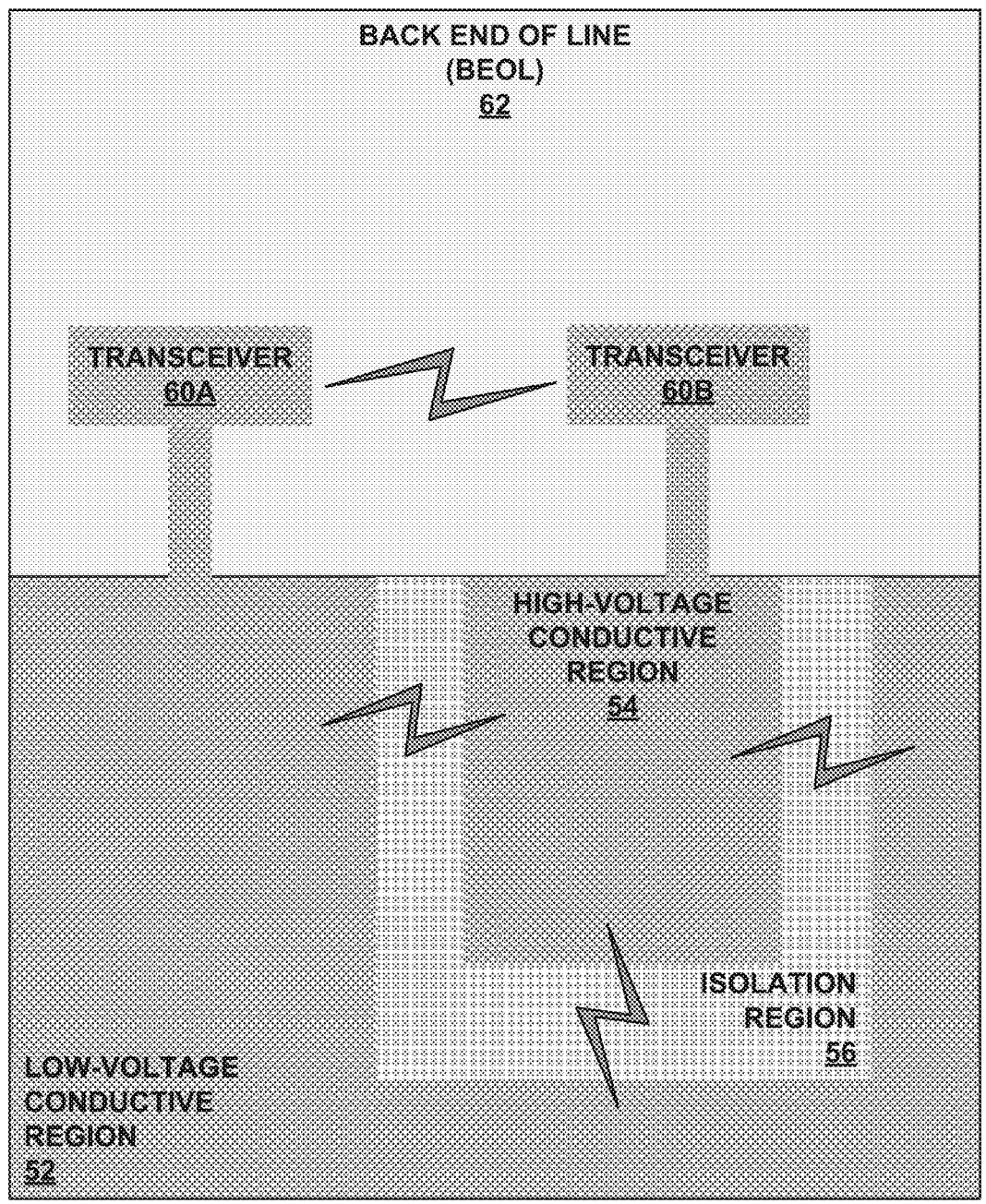
FIG. 3 is a conceptual block diagram of a semiconductor device configured to laterally communicate across an isolation region, in accordance with some examples of this disclosure.

FIG. 3 is a conceptual block diagram of a semiconductor device 50 configured to laterally communicate across an isolation region 56, in accordance with some examples of this disclosure. Semiconductor device 50 is an example of lateral transmission of signals inside of a single device, although multiple devices may be used to laterally transmit and receive signals. Semiconductor device 50 may be an example of device 2 in FIG. 1, but device 2 of FIG. 1 may not necessarily include semiconductor material in all examples.

Low-voltage conductive region 52 may be separated from high-voltage conductive region 54 by at least isolation region 56. Each of conductive regions 52, 54 may include conductive material such as metallic material and/or semiconductor material. Each of conductive regions 52, 54 may be electrically connected to one of transceivers 60A, 60B.

Isolation region 56 may be a three-dimensional structure surrounding high-voltage conductive region 54. Isolation region 56 may be formed using a silicon on insulator (SOI) process, a deep trench isolation (DTI) process, and/or any other isolation process. Conductive regions 52, 54 and isolation region 56 may include semiconductor material such as silicon, germanium, and/or any other suitable semiconductor material.

Each of transceivers 60A, 60B may be configured to transmit and receive signals. Transceiver 60A may be electrically connected to low-voltage conductive region 52, and transceiver 60B may be electrically connected to high-voltage conductive region. Transceiver 60A may be electrically isolated from transceiver 60B by the electrically insulating material in back end of line (BEOL) 62. Transceivers 60A, 60B may be positioned to communicate laterally along the x-axis direction, which may be parallel to the surface of the semiconductor layers. In some examples, the transmission of signals between transceivers 60A, 60B may be partially lateral along the x-axis direction and partially vertical along the y-axis direction.

BEOL 62 may include one or more layers of conductor materials and insulative materials. Low-voltage conductive region 52, high-voltage conductive region 54, and isolation region 56 may be referred to as the "front end of line" (FEOL). The devices and regions of the FEOL may be interconnected by conductive material in BEOL 62, which may not be depicted in FIG. 3.

Figure 4A:
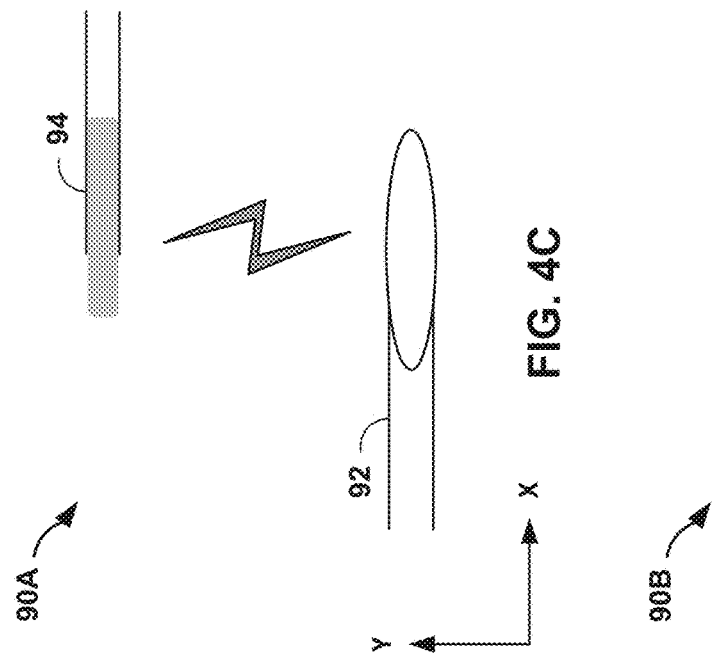
FIGS. 4A, 4B are diagrams of lateral communication from conductor to a sensor, in accordance with some examples of this disclosure.
Figure 4C:
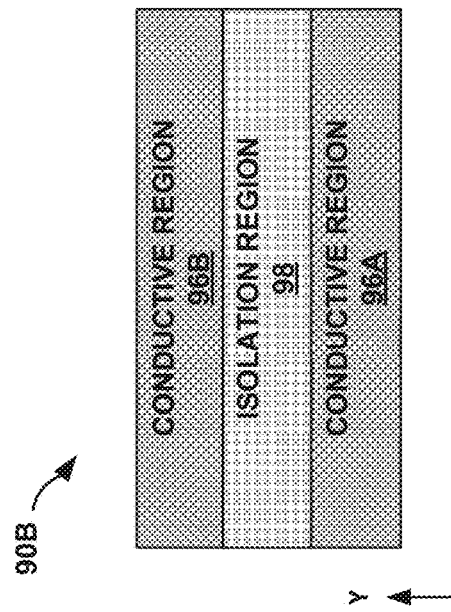
FIGS. 4C, 4D are diagrams of vertical communication from conductor to a sensor.
Figure 4B:
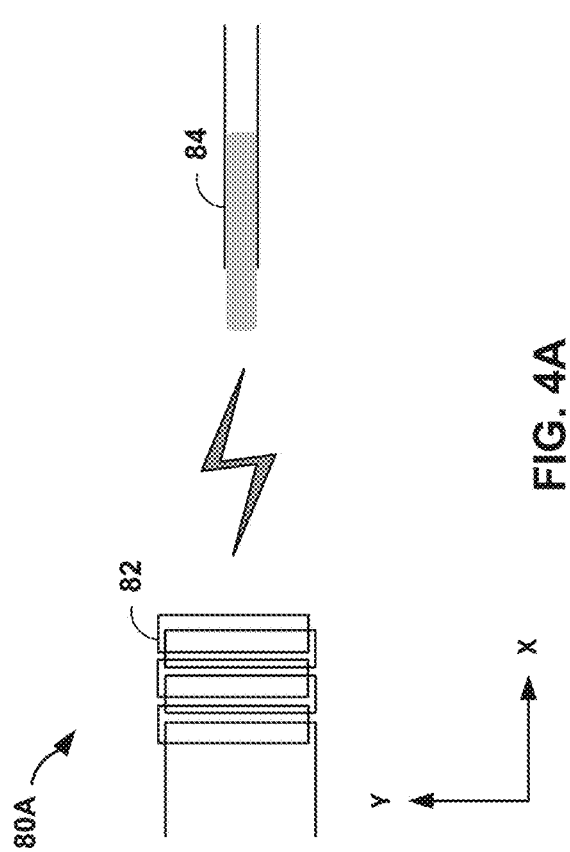

FIGS. 4A, 4B are diagrams of lateral communication from conductor 82 to a sensor 84, in accordance with some examples of this disclosure. The communication in device 80A between conductor 82 and sensor 84 may be lateral along the x-axis direction. The communication in semiconductor device 80B between conductive regions 86A, 86B may be lateral along the x-axis direction. In FIGS. 4A-4D, the x-axis direction may represent a lateral direction, and the y-axis direction may represent a vertical direction. Isolation region 88 may be formed by a SOI process.

Figure 4D:
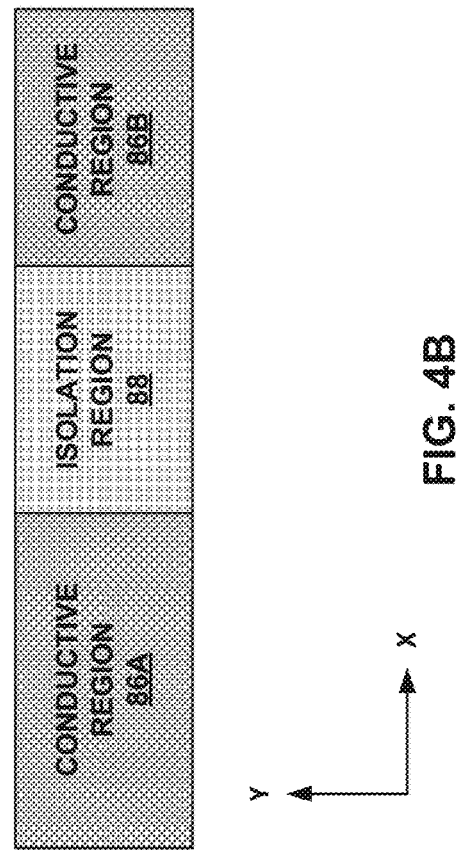

FIGS. 4C, 4D are diagrams of vertical communication from conductor 92 to a sensor 94. The communication in device 90A between conductor 92 and sensor 94 may be lateral along the x-axis direction. The communication in semiconductor device 90B between conductive regions 86A, 86B may be lateral along the x-axis direction.

Figure 5:
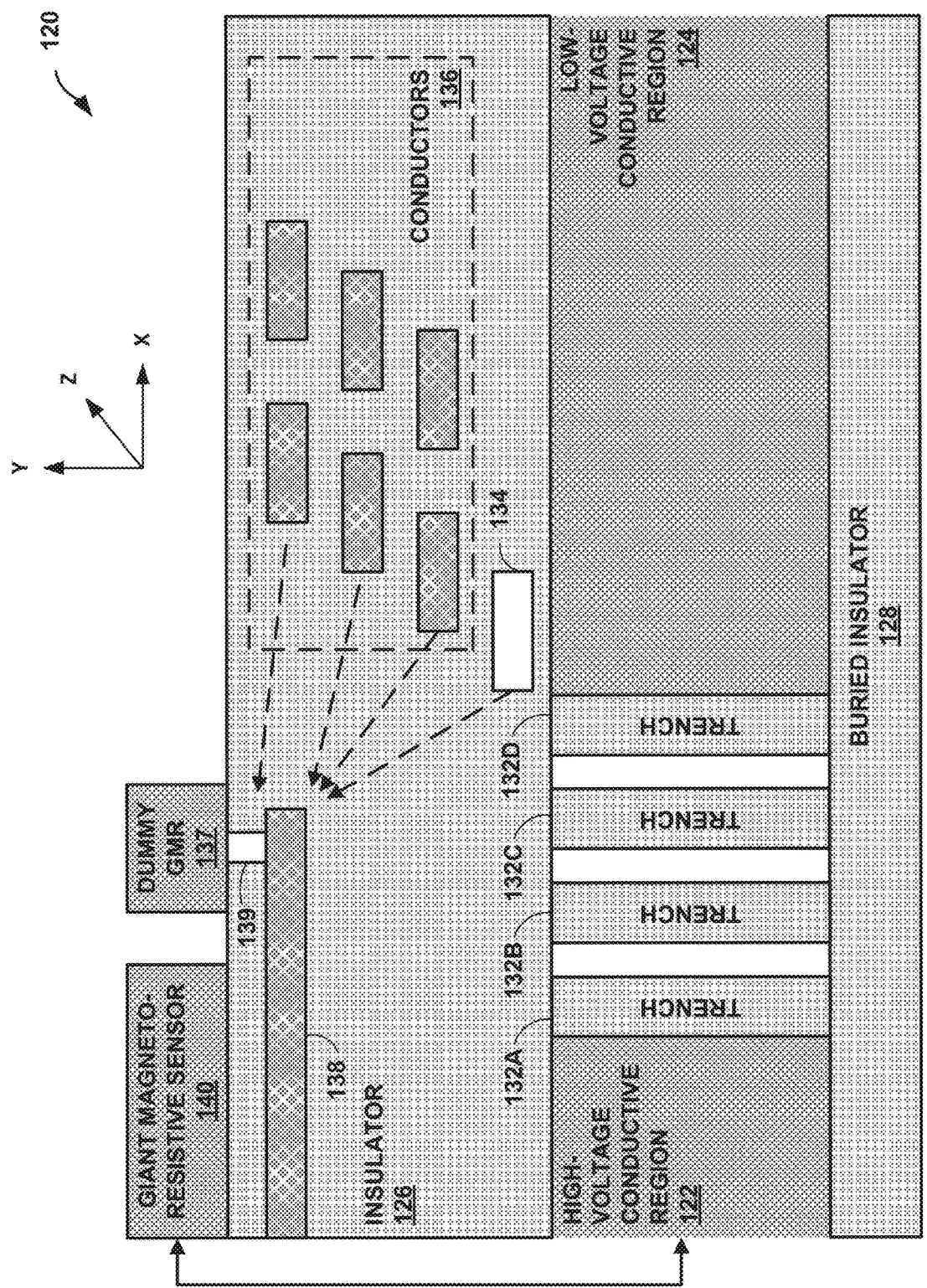
FIG. 5 is a conceptual diagram of a semiconductor die including one or more conductors configured to laterally transmit a magnetic signal to a giant magnetoresistive (GMR) sensor, in accordance with some examples of this disclosure.

FIG. 5 is a conceptual diagram of a semiconductor die 120 including one or more conductors 134, 136 configured to laterally transmit a magnetic signal to a giant magnetoresistive (GMR) sensor 140, in accordance with some examples of this disclosure. Semiconductor die 120 may include a single IC including conductive regions 122, 124, conductors 134, 136, and GMR sensor 140. Semiconductor die 120 may also include a shield that includes GMR 137, conductor shield 138, and via 139.

Insulator 126 and buried insulator 128 may include insulating material such as an oxide to prevent an electrical connection between conductive regions 122, 124 and external components. In some examples, insulator 126 may include field oxide and/or intermetal oxide. Buried insulator 128 may be referred to as a buried oxide (BOX). Trenches 132A-132D may also include insulating material to prevent the flow of electrons between conductive regions 122, 124.

Conductors 134, 136 may be electrically connected to circuitry in low-voltage conductive region 124 and transmission circuitry (not shown in FIG. 5) that is configured to generate signals for conductors 134, 136 to GMR sensor 140. In some examples, conductor 134 may include polysilicon, and conductors 136 may include metallic material. Different materials may be used for many reasons, including to strengthen the strength of the magnetic field generated by conductors 134, 136. In some examples, FIG. 5 may depict a partial cross-section of a magnetizing coil formed by conductors 136. Conductors 134, 136 may be positioned lateral and vertical relative to GMR sensor 140. As shown in FIG. 5, the lateral direction may correspond to the x-axis direction, and the vertical direction may correspond to the y-axis direction.

Conductor shield 138 may be positioned between conductors 134, 136 and GMR sensor 140. Conductor shield 138 may include the same material the layer of conductors 136 that is uppermost in the y-axis direction. Conductor shield 138 may be electrically connected to a local reference voltage of GMR sensor 140. Conductor shield 138 may also be electrically connected to dummy GMR 137 through via 139. Dummy GMR 137 may be operate as part of the shield between conductors 134, 136 and GMR sensor 140. Via 139 may connect dummy GMR 137 and conductor shield 138 to form an extended shield. In some examples, the local reference voltage of GMR sensor 140 may be a reference ground voltage of conductive region 122. The design of semiconductor die 120 may include a minimum distance between conductors 134, 136 and the extended shield that is sufficient to prevent breakdown of insulator 126. The minimum distance may be represented by the arrows from conductors 134, 136 to conductor shield 138.

Conductor shield 138 may reduce the parasitic capacitance between conductors 134, 136 and GMR sensor 140. During relative voltage changes between conductive regions 122, 124, the parasitic capacitance may cause GMR sensor 140 to detect a transmission from conductors 134, 136 where no transmission exists. Moreover, the parasitic capacitance may cause GMR sensor 140 to not detect an actual transmission from conductors 134, 136.

Figure 7A:
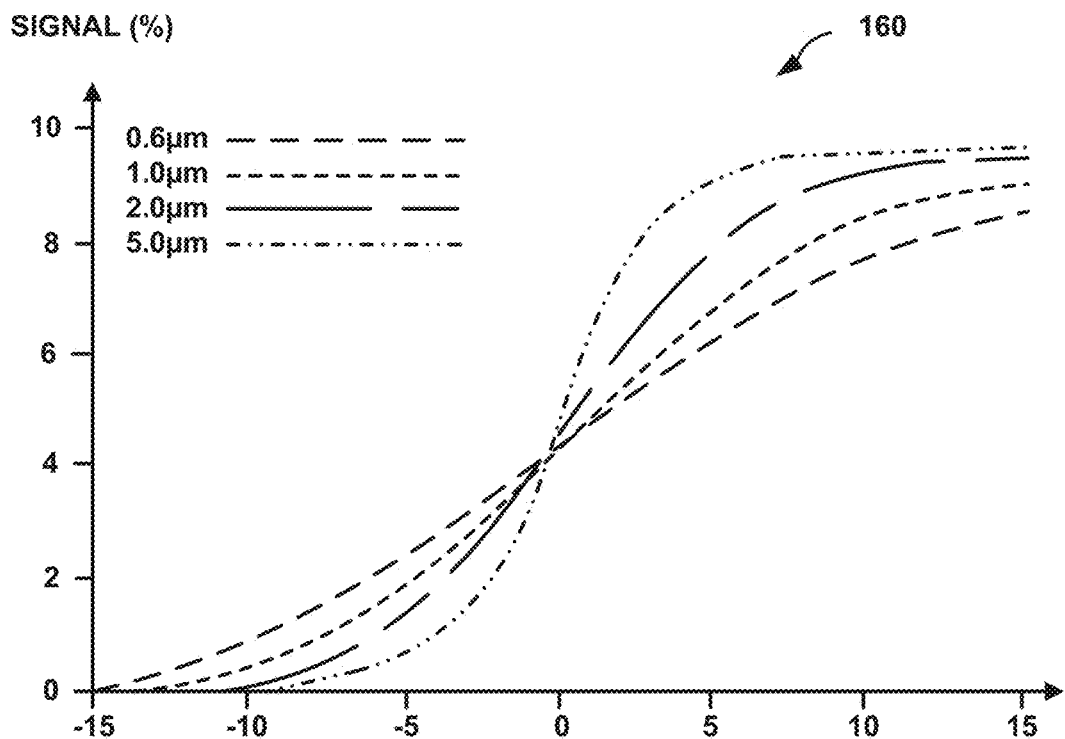
FIG. 7A is a graph relating the percentage variation of a GMR sensor to magnetic field, in accordance with some examples of this disclosure.

GMR sensor 140 may include a single GMR resistor, two GMR resistors in a differential configuration, or a bridge configuration that is arranged in the z-axis direction. In some examples, GMR sensor 140 may include a TMR sensor or an AMR sensor instead of or in addition to a GMR sensor. In a bridge configuration, GMR sensor 140 may be arranged such that a differential signal is generated by the magnetic signals from conductors 134, 136. The transfer curve of the impedance of GMR sensor 140 as a function of the magnetic field in the x-axis direction may be substantially linear, as shown in FIG. 7A. A linear transfer curve may convert a magnetic field acting in the x-axis direction to a varying resistance of GMR sensor 140. Circuitry including threshold values for resistance, current, and/or voltage may convert the varying resistance of GMR sensor 140 to a digital signal at a high frequency.

GMR sensor 140 may be electrically connected to high-voltage semiconductor region 122. Semiconductor die 120 may include receiver circuitry that is electrically connected to high-voltage conductive region 122 to decode and/or process the signals from conductors 134, 136 based on the varying resistance of GMR sensor 140. For example, if semiconductor die 122 includes gate driver circuitry, semiconductor die 122 may output high-voltage control signals from the receiver circuitry.

Figure 6A:
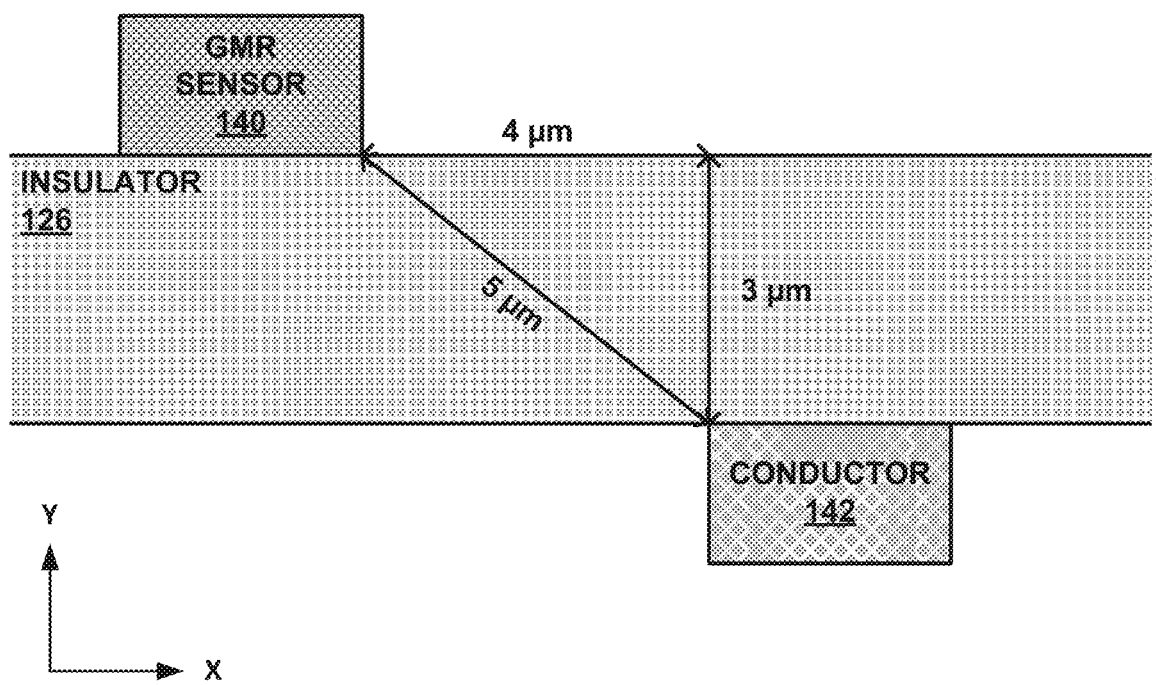
FIG. 6A is a conceptual diagram of a GMR sensor and a conductor separated by an insulator, in accordance with some examples of this disclosure.

FIG. 6A is a conceptual diagram of a GMR sensor 140 and a conductor 142 separated by an insulator 126, in accordance with some examples of this disclosure. The thickness of insulator 126 in the y-axis direction may be three micrometers, in the example of FIG. 6A. In other examples, insulator 126 may a thickness that is four or six micrometers or any other suitable thickness. The breakdown voltage of insulator 126 may be a function of the material of insulator 126. For example, the breakdown voltage of insulator 126 may be one hundred and fifty volts per micrometer. Thus, for a distance of three micrometers between GMR sensor 140 and conductor 142, the breakdown voltage may be four hundred and fifty volts.

If conductor 142 is positioned lateral relative to GMR sensor 140 by four micrometers in the x-axis direction, the total distance between GMR sensor 140 and conductor 142 may be five micrometers. If the breakdown voltage of insulator 126 is one hundred and fifty volts per micrometer, the breakdown voltage for between GMR sensor 140 and conductor 142 may be seven hundred and fifty volts. As a result, the insulator 126 may withstand much higher voltages due to the lateral positioning of conductor 142 relative to GMR sensor 140.

Figure 6B:
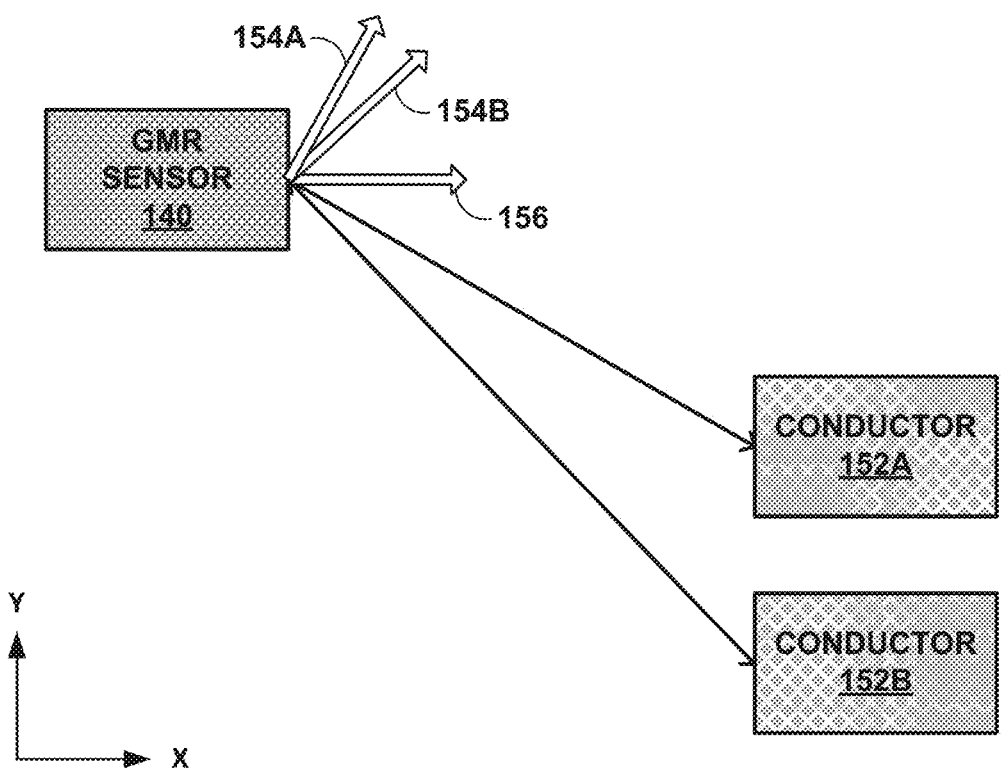
FIG. 6B is a conceptual diagram of the magnetic fields generated by two conductors at a GMR sensor, in accordance with some examples of this disclosure.

FIG. 6B is a conceptual diagram of the magnetic fields generated by two conductors 152A, 152B at a GMR sensor 140, in accordance with some examples of this disclosure. A current through conductor 152A may generate a magnetic field 154A at GMR sensor 140 that is perpendicular to the direction vector from conductor 152A to GMR sensor 140. Magnetic field 154A may include a component in the x-axis direction and a component in the y-axis direction. In some examples, the component of magnetic field 154A in the x-axis direction may affect the impedance of GMR sensor 140, but the component of magnetic field 154A in the y-axis direction may not affect the impedance of GMR sensor 140. A current through conductor 152B may generate a magnetic field 154B at GMR sensor 140 that is perpendicular to the direction vector from conductor 152B to GMR sensor 140. Magnetic field 154B may include a component in the x-axis direction and a component in the y-axis direction. Lateral magnetic field 156, which may include the sum of the lateral components of magnetic fields 154A, 154B, may affect the impedance of GMR sensor 140.

FIG. 7A is a graph 160 relating the percentage variation of a GMR sensor to magnetic field, in accordance with some examples of this disclosure. Graph 160 includes transfer curves for four different widths of a sensor. For a sensor with a width of six hundred nanometers, the transfer curve may be flatter than the transfer curve for a sensor with a width of five micrometers. Thus, the width of the linear range in milliteslas of a sensor with a width of six hundred nanometers may be larger than the width of the linear range for a sensor with a width of five micrometers. The impedance of a sensor may change approximately ten percent from a minimum magnetic field to a maximum magnetic field.

A designer may choose a sensor based on the linear range of the sensor such that the sensor receives signals from a conductor even in the presence of homogeneous disturbance fields. A device may be designed to operate under disturbance fields of twenty milliteslas or thirty milliteslas. Such a design may include a sensor with a relatively narrow width, biasing with permanent magnets, exchange biasing using antiferromagnetic materials, and/or using a sensor in vortex configuration.

Figure 7B:
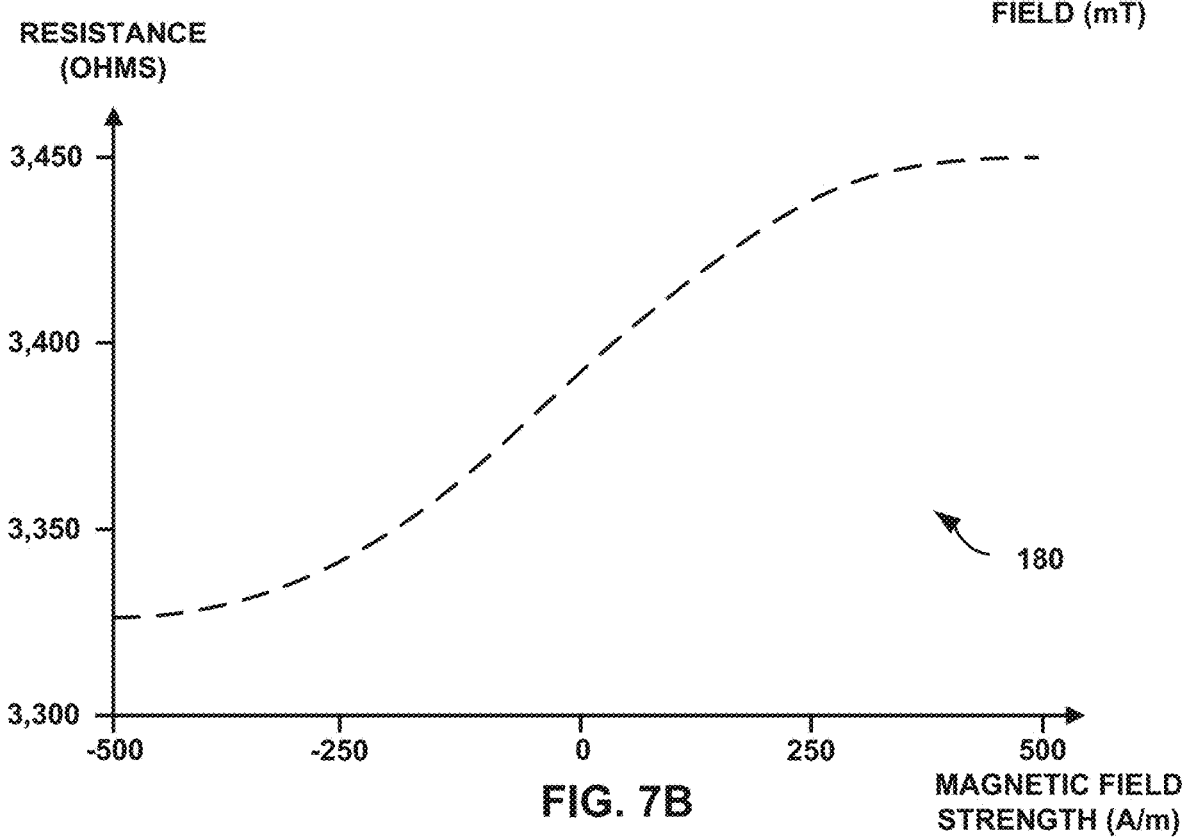
FIG. 7B is a graph relating the resistance of a GMR sensor to the strength of a magnetic field, in accordance with some examples of this disclosure.

FIG. 7B is a graph 180 relating the resistance of a sensor to the strength of a magnetic field, in accordance with some examples of this disclosure. Graph 180 may depict the resistance of the sensor in a vortex configuration. The sensor may include a change in impedance of approximately four percent from a magnetic field strength of negative five hundred oersteds to a magnetic field strength of positive five hundred oersteds.

Figure 8:
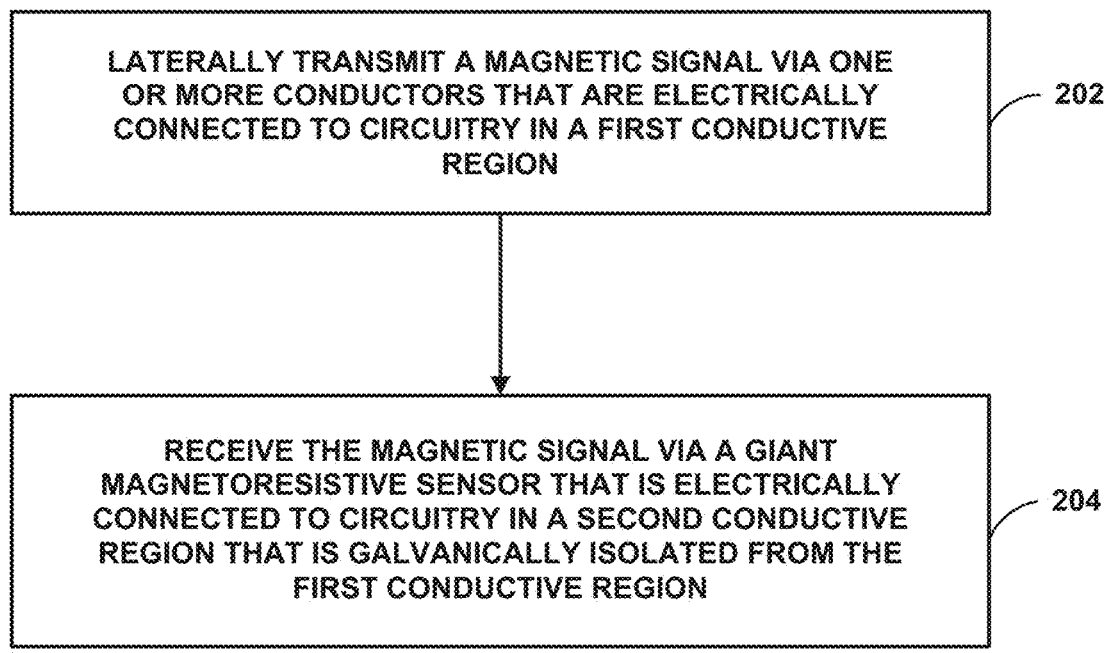
FIG. 8 is a flowchart illustrating a technique for laterally communicating across an isolation barrier using one or more conductors and a GMR sensor, in accordance with some examples of this disclosure.

FIG. 8 is a flowchart illustrating a technique for laterally communicating across an isolation barrier using one or more conductors and a GMR sensor, in accordance with some examples of this disclosure. Technique 200 is described with reference to device 120 in FIG. 5, although other components, such as devices 2, 50, 80 in FIGS. 1, 3, 4A, and 4B, may exemplify similar techniques.

The technique of FIG. 8 includes laterally transmitting a magnetic signal via one or more of conductors 134, 136 that are electrically connected to circuitry in low-voltage conductive region 124 (202). Conductors 134, 136 may be electrically connected to circuitry in low-voltage conductive region 124 and configured to transmit a magnetic signal to GMR sensor 140. Conductors 134, 136 may transmit the magnetic signal across an isolation barrier formed by insulator 126. To increase the distance between conductors 134, 136 and GMR sensor 140, conductors 134, 136 may be positioned at least partially lateral relative to GMR sensor 140. Increasing the separation between conductors 134, 136 and GMR sensor 140 may increase the breakdown voltage of insulator 126 without increasing the thickness of insulator 126.

The technique of FIG. 8 also includes receiving the magnetic signal via GMR sensor 140 that is electrically connected to circuitry in high-voltage conductive region 122 that is galvanically isolated from low-voltage conductive region 124 (204). GMR sensor 140 may include an impedance that varies as a function of a magnetic field. The impedance of GMR sensor 140 may be based on magnetic fields that are perpendicular to the long axis of GMR sensor 140. The long axis of GMR sensor 140 may extend in the z-axis direction of FIG. 5, and GMR sensor 140 may sense magnetic fields in the x-axis direction. A current through conductors 134, 136 may generate a magnetic field at GMR sensor 140 that includes a component in the x-axis direction and a component in the y-axis direction. Semiconductor die 120 may achieve the substantially the same magnetic field at GMR sensor 140 as vertical transmission across a thicker insulator with an increase in current or an increase in the turns of a magnetizing coil of conductors 134.

Figure 9:
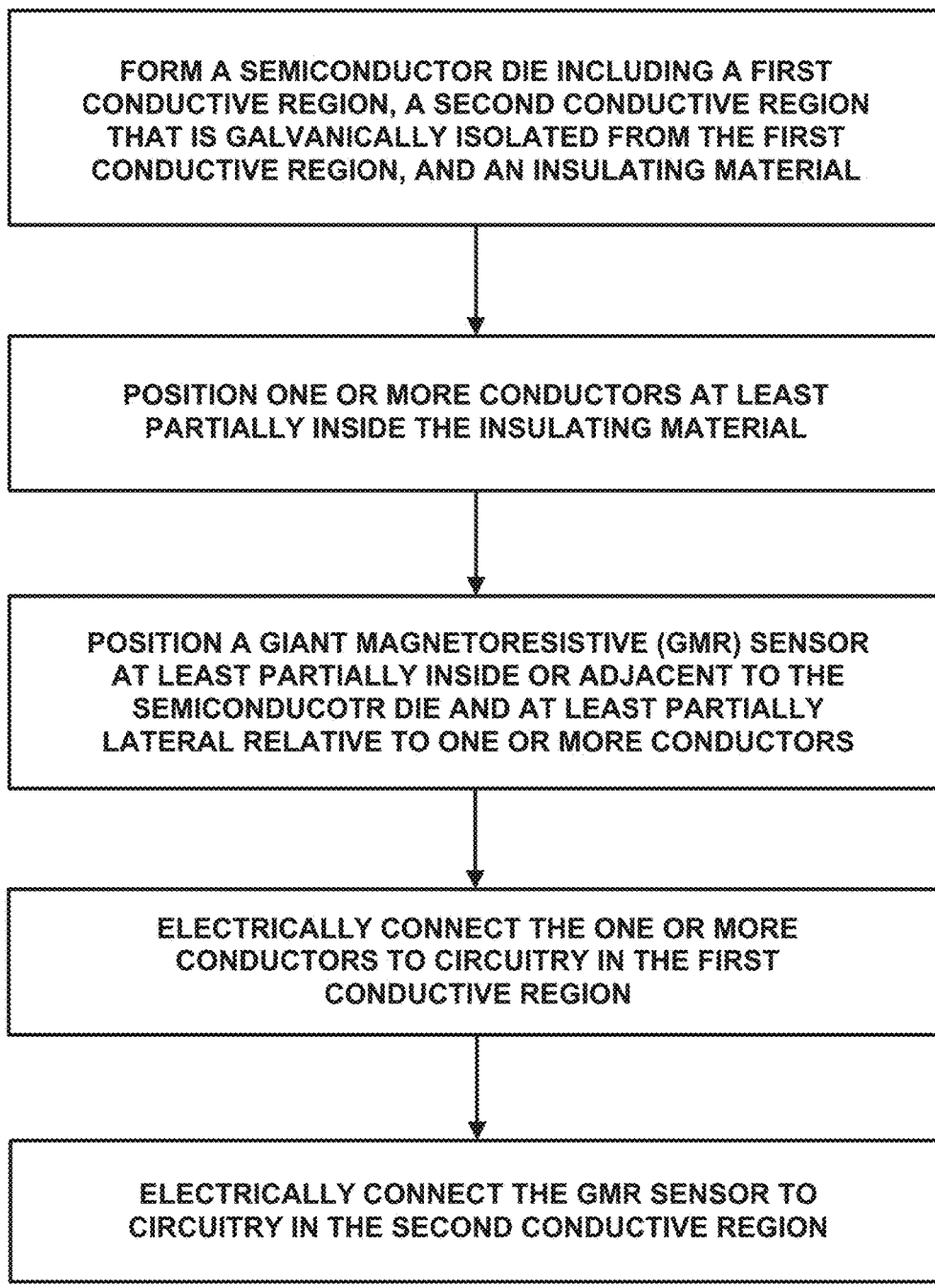
FIG. 9 is a flowchart illustrating a technique for constructing a device for laterally communicating across an isolation barrier using a magnetizing coil and a sensor, in accordance with some examples of this disclosure.

FIG. 9 is a flowchart illustrating a technique for constructing a device for laterally communicating across an isolation barrier using a magnetizing coil and a sensor, in accordance with some examples of this disclosure. Technique 250 is described with reference to device 120 in FIG. 5, although other components, such as devices 2, 50, 80 in FIGS. 1, 3, 4A, and 4B, may exemplify similar techniques.

The technique of FIG. 9 includes forming semiconductor die 120 including conductive regions 122, 124, wherein low-voltage conductive regions is galvanically isolated from high-voltage conductive region 124, and insulator 126 (252). In some examples, conductive regions 122, 124 and insulator 126 may include semiconductor material on a single die.

The technique of FIG. 9 further includes positioning conductors 134, 136 at least partially inside insulator 126 (254). Conductors 134, 136 may include a magnetizing coil, a polysilicon material, and/or any other suitable conductors. Polysilicon may include a higher resistance than metallic conductors, but polysilicon may increase the magnetic field generated by conductors 134, 136. Conductors 134, 136 may extend through insulator 126 and optionally through low-voltage conductive region 124. Insulator 126 may impede the flow of electrons from low-voltage conductive region 124 and conductors 134, 136.

The technique of FIG. 9 further includes positioning GMR sensor 140 at least partially inside or adjacent to semiconductor die 120 and at least partially lateral relative to conductors 134, 136 (256). GMR sensor 140 may be embedded inside of insulator 126 and/or semiconductor die 120. The strength of the magnetic signals received by GMR sensor 140 may be based on the distance between conductors 134, 136 and GMR sensor 140. It may be desirable to decrease the total distance between conductors 134, 136 and GMR sensor 140 to increase the signal strength, while increasing the distance between conductors 134, 136 and GMR sensor 140 through insulator 126 to increase the breakdown voltage.

The technique of FIG. 9 further includes electrically connecting conductors 134, 136 to circuitry in low-voltage conductive region 124 (258). Low-voltage conductive region 124 may be electrically connected to transmission circuitry configured to generate signals for transmission to GMR sensor 140. Microcontroller 22 and Schmitt trigger 24A in FIG. 2 may be an example of transmission circuitry configured to generate signals for transmission. The transmission circuitry may be further configured to cause a current to flow through conductors 134, 136 to transmit the signals to GMR sensor 140. The technique of FIG. 9 further includes electrically connecting GMR sensor 140 to circuitry in high-voltage conductive region 122 (260). High-voltage conductive region 122 may be electrically connected to receiver circuitry configured to decode or process the signals received by GMR sensor 140 from conductors 134, 136. The receiver circuitry may be configured to measure the impedance of GMR sensor 140 by measuring the voltage across GMR sensor 140. Semiconductor die 120 may include communication between two galvanically isolated regions 122, 124 that is at least partially lateral.

Figure 10A:
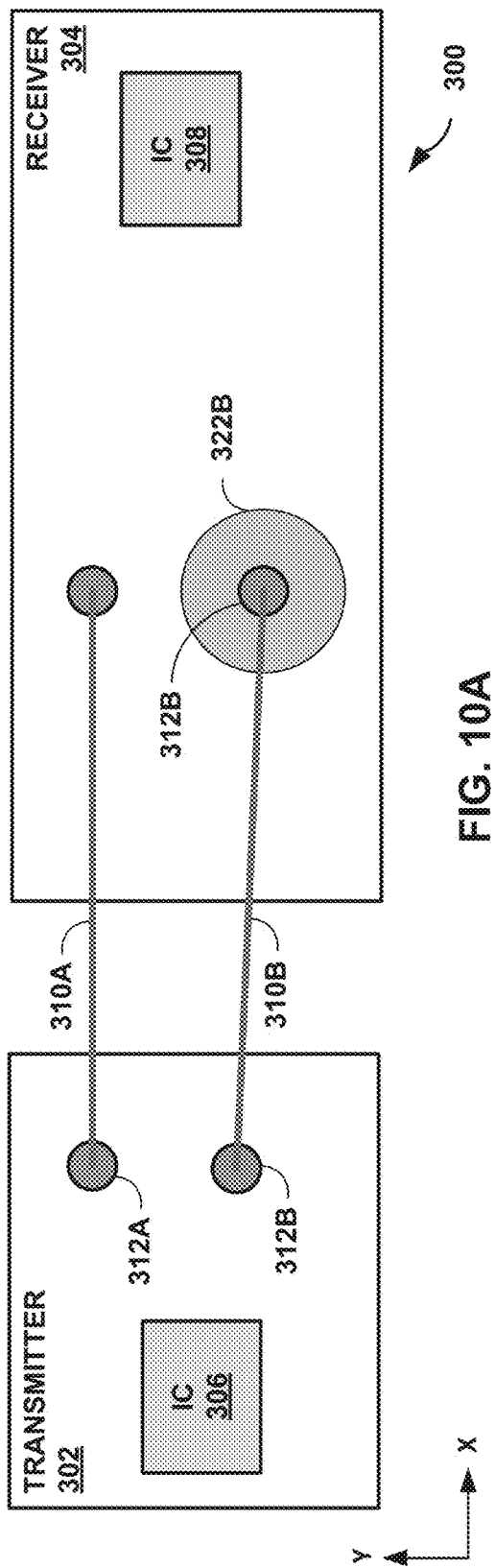
FIGS. 10A, 10B are top-view and side-view diagrams of a system configured to communicate across an isolation barrier using two magnetizing coils.
Figure 10B:
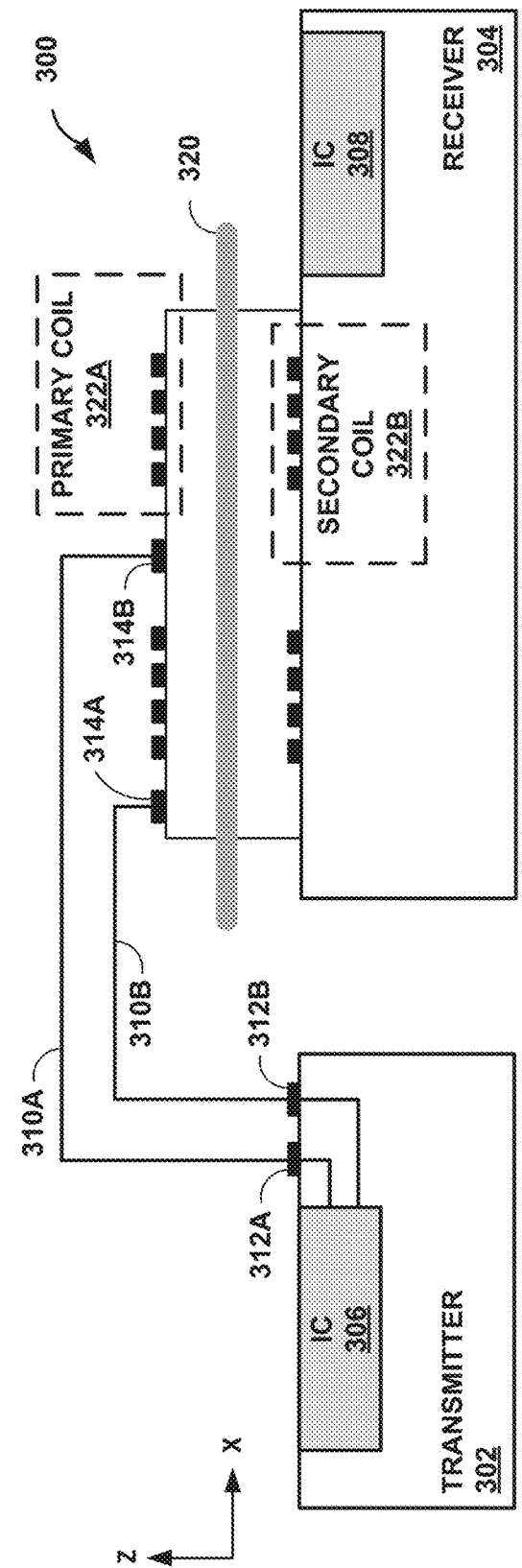

FIGS. 10A, 10B are top-view and side-view diagrams of a system 300 configured to communicate across an isolation barrier 320 using two magnetizing coils 322A, 322B. Transmitter 302 may include IC 306 to generate signals for transmission to IC 308 in receiver 304. Bond wires 310A, 310B may conduct the signals from pins 312A, 312B to pins 314A, 314B. Primary magnetizing coil 322A may transmit the signals across isolation barrier 320 to secondary magnetizing coil 322B. Magnetizing coils 322A, 322B may be referred to as "coreless" coils.

Primary magnetizing coil 322A may be positioned vertically relative to secondary magnetizing coil 322B. The relative positioning of magnetizing coils 322A, 322B may be effective for transmitting a magnetic signal across isolation barrier 320. However, the short or zero lateral spacing of magnetizing coils 322A, 322B may reduce the distance between magnetizing coils 322A, 322B, as compared to greater lateral spacing between magnetizing coils 322A, 322B. For the positioning of magnetizing coils 322A, 322B depicted in FIGS. 10A, 10B, a breakdown voltage of isolation was positioned at least partially lateral relative to secondary magnetizing coil 322B.

Figure 11:
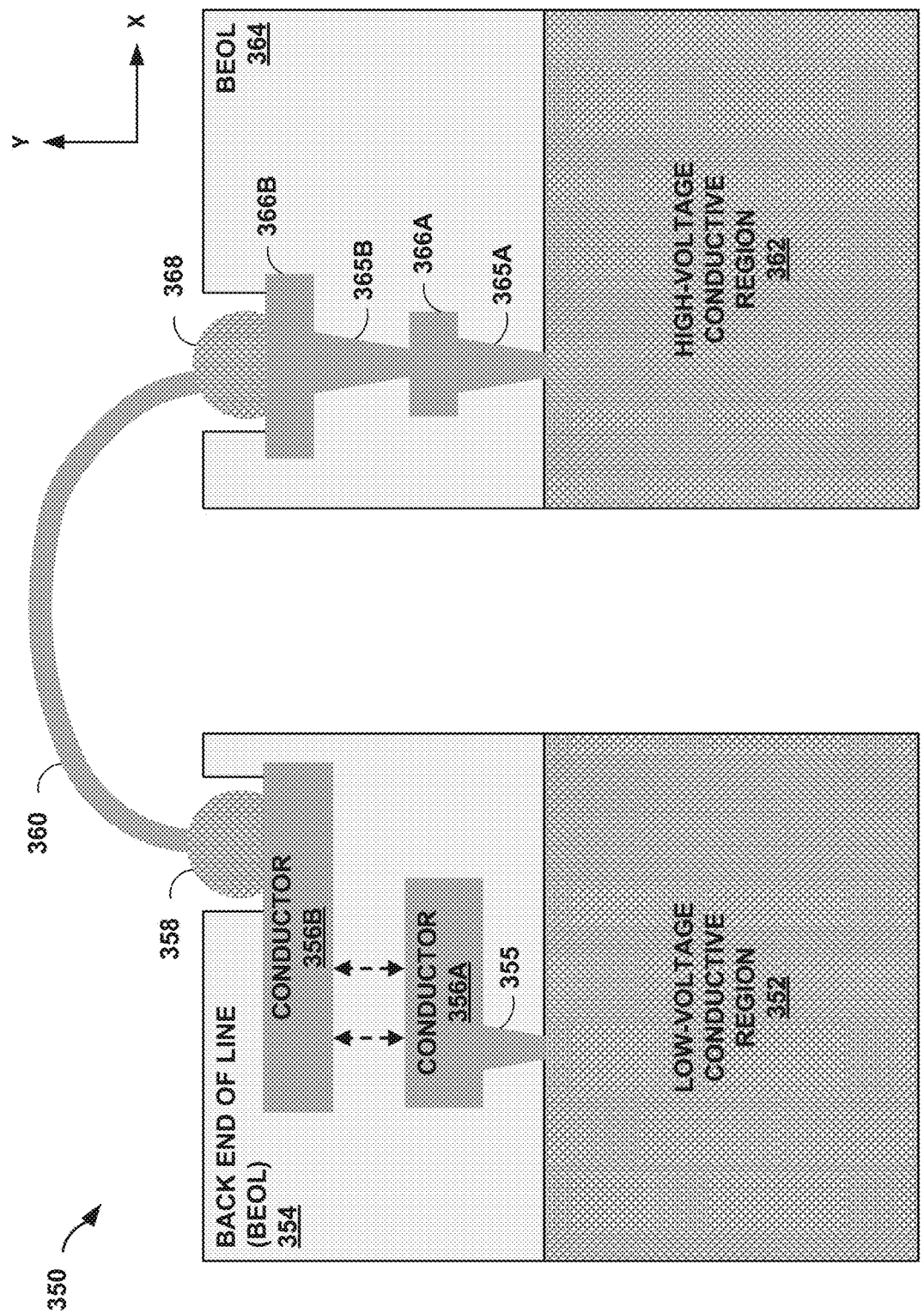
FIG. 11 is a conceptual diagram of a semiconductor system configured to vertically communicate across an isolation barrier using two conductors.

FIG. 11 is a conceptual diagram of a semiconductor system 350 configured to vertically communicate across an isolation barrier using two conductors 356A, 356B. Low-voltage conductive region 352 may transmit a signal to conductor 356B through via 355 and conductor 356A. Conductors 356A, 356B may be electrically isolated by the insulating material of BEOL 354. High-voltage conductive region 362 may receive the signal from conductor 356B through solder balls 358, 368, bond wire 360, conductive layers 366A, 366B, and vias 365A, 365B.

Semiconductor system 350 may include two ICs, which may increase the cost of manufacturing semiconductor system 350. The two ICs may be separated by insulating material formed by an SOI process to prevent electrical conduction between conductive regions 352, 362. The manufacturing process may also include substantial complexity due to the deep vias 355, 365A, 365B. In addition, the thickness of the isolation barrier in BEOL 354 may be larger than the thickness of the isolation barrier in a device including one or more conductors positioned at least partially lateral relative to a GMR sensor. In some examples, the thickness of the isolation barrier may be ten micrometers for an application including a twelve-hundred-volt drop.

The following numbered examples demonstrate one or more aspects of the disclosure.

Example 1

A device includes a first conductive region and a second conductive region that is galvanically isolated from the first conductive region. The device further includes one or more conductors, wherein each conductor of the one or more conductors is electrically connected to the first conductive region. The device also includes a giant magnetoresistive (GMR) sensor electrically connected to the second conductive region and magnetically coupled to the one or more conductors, wherein the GMR sensor is positioned at least partially lateral relative to the one or more conductors.

Example 2

The device of example 1, further including a single semiconductor die including the first conductive region and the second conductive region, wherein the one or more conductors are positioned at least partially inside the single semiconductor die. The GMR sensor is positioned at least partially inside or adjacent to the single semiconductor die.

Example 3

The device of examples 1-2 or any combination thereof, wherein the single semiconductor die includes an insulating material, the one or more conductors are positioned at least partially inside the insulating material, and the GMR sensor is positioned at least partially inside or adjacent to the insulating material.

Example 4

The device of examples 1-3 or any combination thereof, wherein the one or more conductors are configured to transmit a magnetic signal to the GMR sensor at least partially laterally through the insulating material.

Example 5

The device of examples 1-4 or any combination thereof, wherein a voltage difference between the first conductive region and the second conductive region is at least one hundred volts.

Example 6

The device of examples 1-5 or any combination thereof, wherein a distance between the one or more conductors and the GMR sensor is greater than one micrometer, and a ratio of the voltage difference to the distance is greater than one hundred volts per micrometer and less than three hundred volts per micrometer.

Example 7

The device of examples 1-6 or any combination thereof, wherein the one or more conductors includes a metal coil and a poly-silicon material configured to generate a magnetic field.

Example 8

The device of examples 1-7 or any combination thereof, wherein a distance between the one or more conductors and the GMR sensor is greater than three micrometers and less than ten micrometers.

Example 9

The device of examples 1-8 or any combination thereof, wherein the one or more conductors are configured to generate a magnetic field, and the GMR sensor includes a variable impedance based on the strength of a magnetic field.

Example 10

The device of examples 1-9 or any combination thereof, wherein the first conductive region is configured to receive an electrical signal from a microcontroller, and the second conductive region is configured to deliver a control signal to a control terminal of a transistor.

Example 11

A method for communicating, the method including transmitting a magnetic signal via one or more conductors, wherein each conductor of the one or more conductors is electrically connected to a first conductive region. The method further includes receiving the magnetic signal via a giant magnetoresistive (GMR) sensor electrically connected to a second conductive region that is galvanically isolated from the first conductive region, wherein the GMR sensor is positioned at least partially lateral relative to the one or more conductors Example 12

The method of example 11, wherein the first conductive region and the second conductive region are positioned inside a single semiconductor die, the one or more conductors are positioned at least partially inside the single semiconductor die, and the GMR sensor is positioned at least partially inside or adjacent to the single semiconductor die.

Example 13

The method of examples 11-12 or any combination thereof, wherein the one or more conductors are positioned at least partially inside an insulating material that is inside the single semiconductor die, and the GMR sensor is positioned at least partially inside or adjacent to the insulating material.

Example 14

The method of examples 11-13 or any combination thereof, wherein transmitting the magnetic signal includes transmitting the magnetic signal to the GMR sensor at least partially laterally through the insulating material.

Example 15

The method of examples 11-14 or any combination thereof, wherein a voltage difference between the first conductive region and the second conductive region is at least one hundred volts.

Example 16

The method of examples 11-15 or any combination thereof, wherein the one or more conductors includes a metal coil configured to generate a magnetic field, and a poly-silicon material configured to generate a magnetic field.

Example 17

The method of examples 11-16 or any combination thereof, wherein transmitting the magnetic signal includes generating a magnetic field via the one or more conductors, and receiving the magnetic signal includes adjusting, at the GMR sensor, an impedance based on the strength of the magnetic field.

Example 18

The method of examples 11-17 or any combination thereof, further including delivering, via the second conductive region, a control signal to a control terminal of a transistor.

Example 19

A semiconductor device includes a single semiconductor die, wherein the single semiconductor die includes a first conductive region, a second conductive region that is galvanically isolated from the first conductive region, and an insulating material. The semiconductor device further includes the one or more conductors positioned at least partially inside the insulating material, wherein each conductor of the one or more conductors are electrically connected to the first conductive region. The semiconductor device also includes a giant magnetoresistive (GMR) sensor electrically connected to the second conductive region and magnetically coupled to the one or more conductors, wherein the one or more conductors are configured to transmit magnetic signals at least partially laterally through the insulating material to the GMR sensor.

Example 20

The semiconductor device of example 19, wherein the one or more conductors include a metal material and is configured to generate a magnetic field, the insulating material includes an oxide material, and the GMR sensor includes a variable impedance that is based on the strength of a magnetic field.

Example 21

The device of examples 1-10 or any combination thereof, further including a conductor shield positioned between the one or more conductors and the GMR sensor, wherein the conductor shield is electrically connected to a local reference voltage of the GMR sensor.

Various examples of the disclosure have been described. Any combination of the described systems, operations, or functions is contemplated. These and other examples are within the scope of the following claims.

What is claimed is:
1. A device comprising:
  a first conductive region;
  a second conductive region that is galvanically isolated from the first conductive region;
  an insulating material;
  one or more conductors positioned at least partially inside the insulating material, wherein each conductor of the one or more conductors is electrically connected to circuitry in the first conductive region; and
  a magnetoresistive (MR) sensor electrically connected to circuitry in the second conductive region and magnetically coupled to the one or more conductors, wherein the MR sensor is positioned at least partially lateral relative to the one or more conductors.

2. The device of claim 1, further comprising a single semiconductor die including the first conductive region, the insulating material, and the second conductive region,
wherein the MR sensor is positioned at least partially inside or adjacent to the single semiconductor die.

3. The device of claim 2, wherein the MR sensor is positioned at least partially inside or adjacent to the insulating material.

4. The device of claim 3, wherein the one or more conductors are configured to transmit a magnetic signal to the MR sensor at least partially laterally through the insulating material.

5. The device of claim 1, wherein a voltage difference between the first conductive region and the second conductive region is at least one hundred volts.

6. The device of claim 5, wherein:
a distance between the one or more conductors and the MR sensor is greater than one micrometer; and
a ratio of the voltage difference to the distance is greater than one hundred volts per micrometer and less than three hundred volts per micrometer.

7. The device of claim 1, wherein the one or more conductors includes a metal coil and a poly-silicon material configured to generate a magnetic field.

8. The device of claim 1, wherein a distance between the one or more conductors and the MR sensor is greater than three micrometers and less than ten micrometers.

9. The device of claim 1, wherein:
the one or more conductors are configured to generate a magnetic field; and
the MR sensor includes a variable impedance based on the strength of a magnetic field.

10. The device of claim 1, wherein:
the first conductive region is configured to receive an electrical signal from a microcontroller; and
the second conductive region is configured to deliver a control signal to a control terminal of a transistor.

11. The device of claim 1, further comprising a conductor shield positioned between the one or more conductors and the MR sensor, wherein the conductor shield is electrically connected to a local reference voltage of the MR sensor.

12. The device of claim 1, wherein the MR sensor comprises a tunnel magnetoresistance sensor.

13. A method for communicating, the method comprising:
transmitting a magnetic signal via one or more conductors, wherein the one or more conductors are positioned at least partially inside an insulating material, and wherein each conductor of the one or more conductors is electrically connected to circuitry in a first conductive region; and
receiving the magnetic signal via a magnetoresistive (MR) sensor electrically connected to circuitry in a second conductive region that is galvanically isolated from the first conductive region, wherein the MR is magnetically coupled to the one or more conductors, and wherein the MR sensor is positioned at least partially lateral relative to the one or more conductors.

14. The method of claim 13, wherein:
the first conductive region, the insulating material, and the second conductive region are positioned inside a single semiconductor die; and
the MR sensor is positioned at least partially inside or adjacent to the single semiconductor die.

15. The method of claim 14,
wherein the MR sensor is positioned at least partially inside or adjacent to the insulating material, and
wherein transmitting the magnetic signal comprises transmitting the magnetic signal to the MR sensor at least partially laterally through the insulating material.

16. The method of claim 13, wherein the one or more conductors includes:
a metal coil configured to generate a magnetic field; and
a poly-silicon material configured to generate a magnetic field.

17. The method of claim 13, wherein:
transmitting the magnetic signal comprises generating a magnetic field via the one or more conductors; and
receiving the magnetic signal comprises adjusting, at the MR sensor, an impedance based on the strength of the magnetic field.

18. A semiconductor device comprising a single semiconductor die, wherein:
the single semiconductor die includes a first conductive region, a second conductive region that is galvanically isolated from the first conductive region, and an insulating material; and
the semiconductor device further comprises:
the one or more conductors positioned at least partially inside the insulating material, wherein each conductor of the one or more conductors are electrically connected to circuitry in the first conductive region, and
a magnetoresistive (MR) sensor electrically connected to circuitry in the second conductive region and magnetically coupled to the one or more conductors, wherein the MR sensor is positioned at least partially lateral relative to the one or more conductors, and wherein the one or more conductors are configured to transmit magnetic signals at least partially laterally through the insulating material to the MR sensor.

19. The semiconductor device of claim 18, wherein:
the one or more conductors include a metal material and is configured to generate a magnetic field;
the insulating material includes an oxide material; and
the MR sensor includes a variable impedance that is based on the strength of a magnetic field.

20. The semiconductor device of claim 18, wherein the MR sensor comprises a tunnel magnetoresistance sensor.

* * * * *